(12) United States Patent
Maatta

(10) Patent No.: US 7,458,826 B1
(45) Date of Patent: Dec. 2, 2008

(54) COMPRESSION CONNECTOR FOR CONNECTING ELECTRICAL COMPONENTS

(75) Inventor: Veli Matti Maatta, Apex, NC (US)

(73) Assignee: Sony Ericsson Mobile Communications AB, Lund (SE)

( * ) Notice: Subject to any disclaimer, the term of this patent is extended or adjusted under 35 U.S.C. 154(b) by 0 days.

(21) Appl. No.: 11/837,975

(22) Filed: Aug. 13, 2007

(51) Int. Cl.
*H01R 12/00* (2006.01)

(52) U.S. Cl. .......................................... 439/79

(58) Field of Classification Search ................. 439/79
See application file for complete search history.

(56) References Cited

U.S. PATENT DOCUMENTS

| | | | | |
|---|---|---|---|---|
| 5,816,826 A * | 10/1998 | Colemen | .................... | 439/64 |
| 6,129,562 A * | 10/2000 | Hong | ........................ | 439/79 |
| 6,524,118 B1 * | 2/2003 | Kikuchi et al. | ................ | 439/79 |
| 6,692,273 B1 * | 2/2004 | Korsunsky et al. | .......... | 439/108 |
| 6,752,662 B2 * | 6/2004 | Okamoto | .................... | 439/607 |
| 6,814,623 B2 | 11/2004 | Hashiba | | |
| 6,908,347 B2 | 6/2005 | Sasaki | | |
| 6,953,350 B2 * | 10/2005 | Shiu | ............................ | 439/79 |
| 7,188,408 B2 * | 3/2007 | Korsunsky et al. | ............ | 29/831 |
| 7,217,159 B2 * | 5/2007 | Chung | ........................ | 439/607 |
| 2002/0004341 A1 | 1/2002 | Hayashi et al. | | |
| 2003/0207600 A1 * | 11/2003 | Ho | .............................. | 439/79 |
| 2004/0147145 A1 * | 7/2004 | Yu | ............................... | 439/79 |
| 2005/0026473 A1 * | 2/2005 | Shiu | ............................ | 439/79 |
| 2006/0234530 A1 * | 10/2006 | Chung | ........................ | 439/79 |

FOREIGN PATENT DOCUMENTS

| | | |
|---|---|---|
| DE | 199 34 119 A1 | 4/2000 |
| EP | 1 128 489 A1 | 8/2001 |
| FR | 2 794 281 | 12/2000 |

OTHER PUBLICATIONS

International Search Report and Written Opinion of the International Searching Authority from corresponding International Application No. PCT/US2008/000338, filed Apr. 14, 2008.

\* cited by examiner

*Primary Examiner*—Gary F. Paumen
(74) *Attorney, Agent, or Firm*—Renner, Otto, Boisselle & Sklar, LLP

(57) ABSTRACT

A compression connector for connecting electrical components that is easily assembled without the need to align multiple components (e.g., circuit board, electrical component, housing parts, etc.) and does not stress or otherwise apply a force to an external housing of an electronic device. The compression connector also can mechanically secure the electrical components together thereby making assembly of an electrical device efficient.

23 Claims, 6 Drawing Sheets

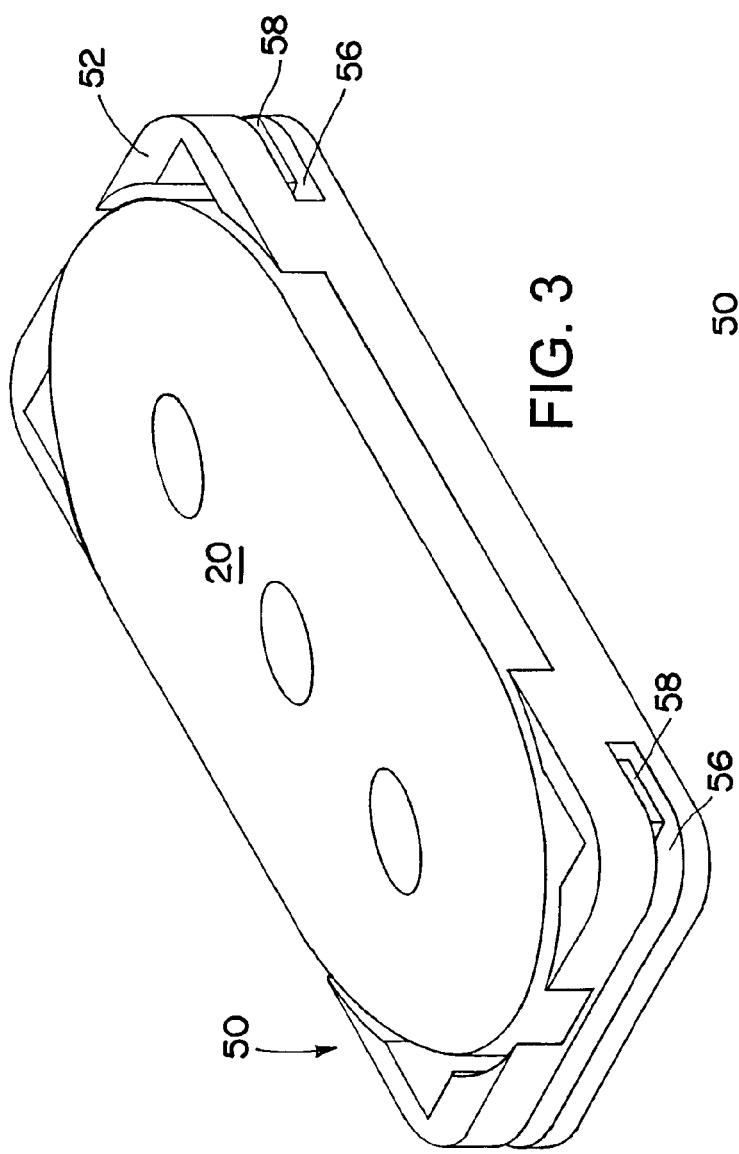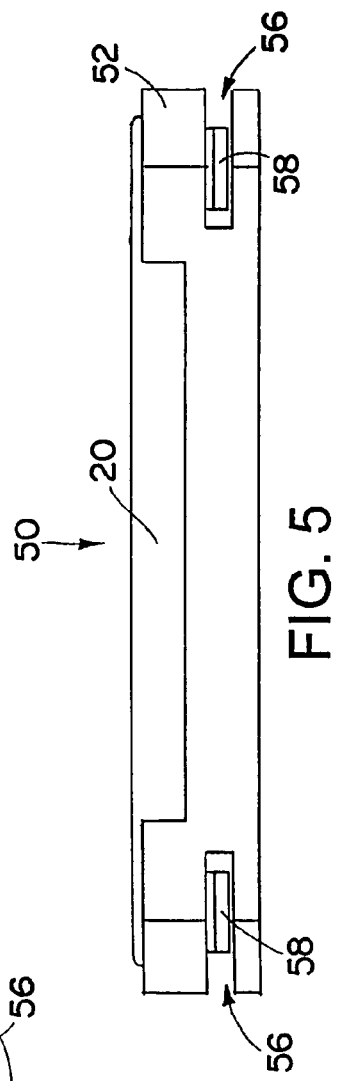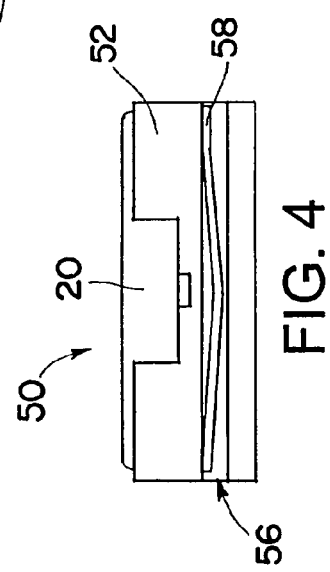

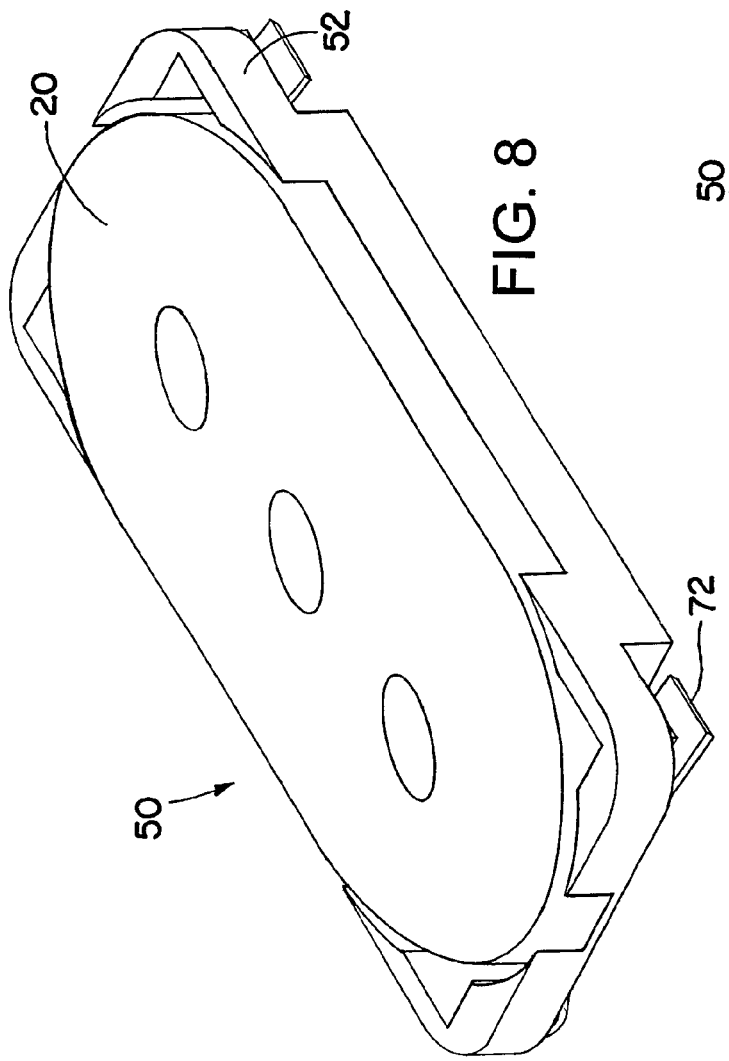
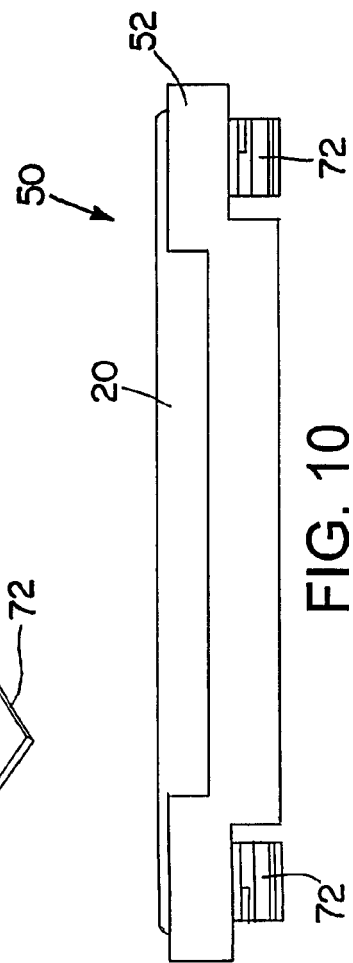
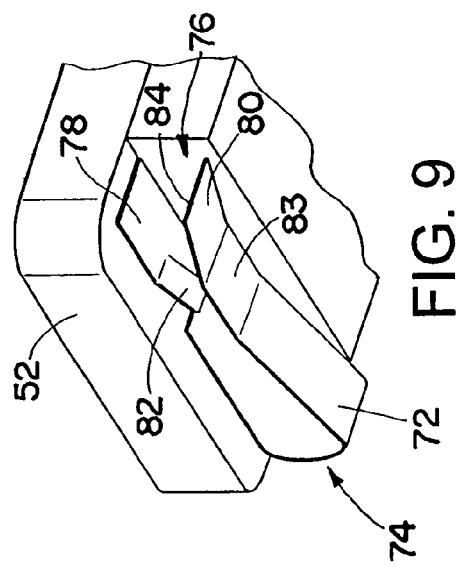
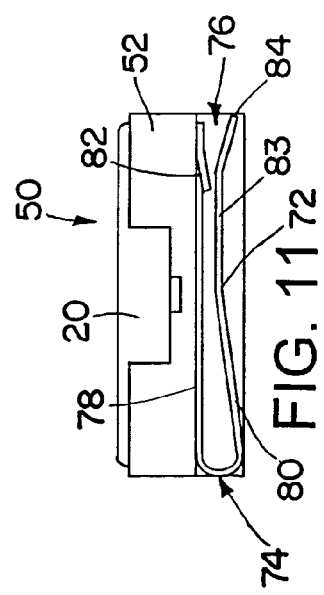

COMPRESSION CONNECTOR FOR CONNECTING ELECTRICAL COMPONENTS

TECHNICAL FIELD OF THE INVENTION

The present invention relates generally to electronic equipment and, more particularly, to a compression connector for connecting electrical components.

DESCRIPTION OF THE RELATED ART

Compression type connectors are commonly used for making electrical connection between a first electronic component (e.g., an electronic circuit board) and at least one other electrical component (e.g., a speaker, a display, a microphone, another electronic circuit board, etc.) in an electronic device.

One of the most basic compression connectors is simply a conductive spring element interposed between contacts on respective electrical components. Typically, such a spring contact is secured to one or both of the electrical components and is slightly compressed between the electrical components to thereby maintain an electrical connection. To maintain the spring contact in a slightly compressed state, the electrical components typically are secured relative to each other such that the spring is compressed slightly.

A typical manner of securing the electrical components relative to each other to maintain the spring in a compressed state is to use an external housing or other structure of the electronic device to support the electrical components in a desired position. In such an arrangement, the spring generally applies a separating force to the housing that can cause the housing to tend to separate over time and/or can deform or stress the housing components. Further, assembly of such a connection can be cumbersome as several parts (e.g., the spring, the electrical components, the housing parts, etc.) may need to be aligned to ensure a proper connection.

SUMMARY

The present invention provides a compression connector for connecting electrical components that is easily assembled without the need to align multiple components (e.g., circuit board, electrical component, housing parts, etc.) and avoids stressing or otherwise applying a force to an external housing of an electronic device. The compression connector also can mechanically secure the electrical components together thereby making assembly even more efficient.

One aspect of the technology relates to a compression connector for connecting electrical components comprising a connector body for supporting a first electrical component, the connector body having an engagement member for engaging opposing surfaces of a second electrical component having an electrical contact thereon, wherein the engagement member has a conductive element configured to compressively engage the contact on the second electrical component to thereby electrically couple the first and second electrical components when the engagement member is engaged with opposing surfaces of the second electrical component.

According to another aspect, at least a portion of the conductive element is resilient and configured to compressively engage the electrical contact on the second electrical component when the engagement member is engaged with opposing sides of the second electrical component.

According to another aspect, the engagement member includes a slot formed in an edge of the connector body, the slot adapted to receive an edge of a circuit board of the electrical component.

According to another aspect, the conductive element includes a spring element supported within the slot and configured to compress when the engagement member is engaged with opposing sides of the second electrical component.

According to another aspect, the spring element includes a leaf spring.

According to another aspect, the engagement element includes a clip configured to compressively engage opposing surfaces of the second electrical component.

According to another aspect, the clip is a resilient conductive spring clip configured to compressively engage opposing sides of the second electrical element.

According to another aspect, the engagement member includes a recess or protrusion configured to cooperate with a mating protrusion or recess on the second electrical component to restrict removal of the connector therefrom once installed.

According to another aspect, the first electronic component is a speaker.

According to another aspect, the second electronic device is a circuit board.

According to another aspect, the circuit board includes a notch adapted to receive the connector body.

According to another aspect, the notch conforms to the shape of the connector body.

According to another aspect, an electronic device comprises a first electrical component, a second electrical component, and a compression connector for electrically coupling the first and second electrical components, wherein the connector includes a connector body for supporting the first electrical component, the connector body having an engagement member for engaging opposing surfaces of the second electrical component, and wherein the engagement member has a conductive element configured to make electrical contact with an electrical contact on the second electrical component to thereby electrically couple the first and second electrical components.

According to another aspect, at least a portion of the conductive element is resilient and configured to compressively engage the electrical contact on the second electrical component when the engagement member is engaged with opposing sides of the second electrical component.

According to another aspect, the engagement member includes a slot formed in an edge of the connector body, the slot adapted to receive an edge of a circuit board of the second electrical component.

According to another aspect, the conductive element includes a spring element supported within the slot and configured to compress when the engagement member is engaged with opposing sides of the second electrical component.

According to another aspect, the spring element includes a leaf spring.

According to another aspect, the engagement member includes a clip configured to compressively engage opposing surfaces of the second electrical component.

According to another aspect, the clip is a resilient conductive spring clip configured to compressively engage opposing sides of the second electrical element.

According to another aspect, the engagement member includes a recess or protrusion configured to cooperate with a mating protrusion or recess on the second electrical component to restrict removal of the connector therefrom once installed.

According to another aspect, the first electronic component is a speaker.

According to another aspect, the second electronic component is a circuit board.

According to another aspect, the circuit board includes a notch adapted to receive the connector body.

According to another aspect, the notch conforms to the shape of the connector body.

According to another aspect, the electronic device is a mobile telephone.

To the accomplishment of the foregoing and the related ends, the invention, then, comprises the features hereinafter fully described in the specification and particularly pointed out in the claims, the following description and the annexed drawings setting forth in detail certain illustrative embodiments of the invention, these being indicative, however, of but several of the various ways in which the principles of the invention may be suitably employed.

Other systems, methods, features, and advantages of the invention will be or become apparent to one with skill in the art upon examination of the following drawings and detailed description. It is intended that all such additional systems, methods, features, and advantages be included within this description, be within the scope of the present invention, and be protected by the accompanying claims.

Although the invention is shown and described with respect to one or more embodiments, it is to be understood that equivalents and modifications will occur to others skilled in the art upon the reading and understanding of the specification. The present invention includes all such equivalents and modifications, and is limited only by the scope of the claims.

Also, although the various features are described and are illustrated in respective drawings/embodiments, it will be appreciated that features of a given drawing or embodiment may be used in one or more other drawings or embodiments of the invention.

It should be emphasized that the term "comprise/comprising" when used in this specification is taken to specify the presence of stated features, integers, steps or components but does not preclude the presence or addition of one or more other features, integers, steps, components or groups thereof."

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Likewise, elements and features depicted in one drawing may be combined with elements and features depicted in additional drawings. Moreover, in the drawings, like reference numerals designate corresponding parts throughout the several views.

FIG. 3 is a perspective view of a speaker and a compression connector in accordance with an exemplary embodiment of the invention.

FIG. 4 is an end view of the speaker and a compression connector of FIG. 3.

FIG. 5 is a side view of the speaker and a compression connector of FIG. 3.

FIG. 8 is a perspective view of a speaker and a compression connector in accordance with another exemplary embodiment of the invention.

FIG. 9 is another perspective view of the speaker and a compression connector of FIG. 8.

FIG. 10 is a side view of the speaker and a compression connector of FIG. 8.

FIG. 11 is an end view of the speaker and a compression connector of FIG. 8.

DETAILED DESCRIPTION OF EMBODIMENTS

Figure 1:
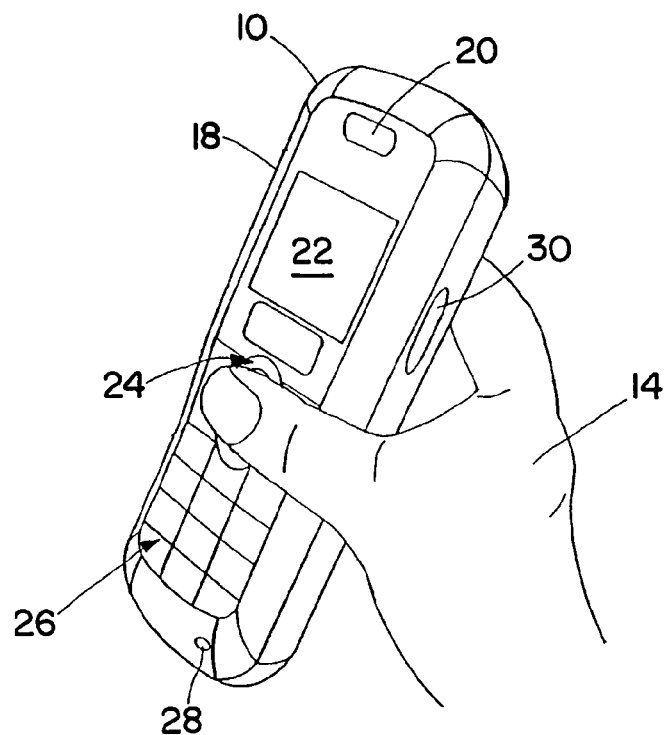
FIG. 1 is an illustration of an exemplary mobile phone.

The present invention will now be described with reference to the drawings, wherein like reference numerals are used to refer to like elements throughout.

The term "electronic equipment" and/or "electronic device" includes portable radio communication equipment. The term "portable radio communication equipment," which herein after is referred to as a "mobile radio terminal," "mobile phone," "mobile device," or "mobile terminal", and the like, includes all equipment such as mobile telephones, pagers, communicators, i.e., electronic organizers, personal digital assistants (PDAs), smartphones, portable communication apparatus or the like.

In the present application, the invention is described primarily in the context of a mobile phone. However, it will be appreciated that the invention is not intended to be limited to a mobile phone and can be any type of electronic equipment. As will be appreciated, the invention is applicable to both portable devices (e.g., hand held mobile phones) and non-portable devices (e.g., devices integrated within the vehicle, such as an integrated telematics system). As used herein, a telematics system refers to a mobile phone system integrated within the vehicle. With the exception of the portability and some functional differences, the telematics system of a vehicle performs many of the functions of a conventional hand-held mobile phone.

Referring now to FIG. 1, a mobile phone 10 is shown as having a "brick" or "block" design type housing 18 (sometimes referred to as a case), but it will be appreciated that other type housings, such as, for example, clam shell or slide-type housings, may be utilized without departing from the scope of the invention. The mobile phone 10 further includes a speaker 20, display 22, a navigation switch and selection/function keys or switches 24, a key pad 26, a microphone 28, and a side switch 30; these are illustrative and exemplary of parts of a typical mobile phone, but it will be appreciated that other parts that are similar or different in form and/or function may be included in the mobile phone 10. The mobile phones to which the invention pertains also may be of the types that have more or fewer functions, keys, etc., compared to those illustrated and described herein.

As will be appreciated, the mobile phone 10 may function as a conventional mobile phone. The mobile phone 10 may have additional functions and capabilities that may be developed in the future. From a conventional point of view, the display 22 displays information to a user, such as operating state, time, phone numbers, contact information, various navigational menus, etc., which facilitate and/or enable the user to utilize the various features of the mobile phone. The display also may be used to view movies, images, or to play games, for example. Part or all of the display 22 may be a touch screen type device. The navigation and function keys 24 and the keypad 26 may be conventional in that they provide for a variety of user operations. For example, one or more of the function keys and navigation device 24 may be used to navigate through a menu displayed on the display 22 to select different phone functions, profiles, settings, etc., as is conventional. The keypad 26 typically includes one or more special function keys, such as, a "call send" key for initiating or answering a call, a "call end" key for ending or hanging up a call, and dialing keys for dialing a telephone number. Other keys included in the navigation and function keys 24 and/or keypad 26 may include an on/off power key, a web browser launch key, a camera key, a voice mail key, a calendar key, etc. The side switch 30 can be configured to perform any of a wide variety of functions. The specific function of the side switch 30 is not germane to the invention as will be appreciated.

Figure 2:
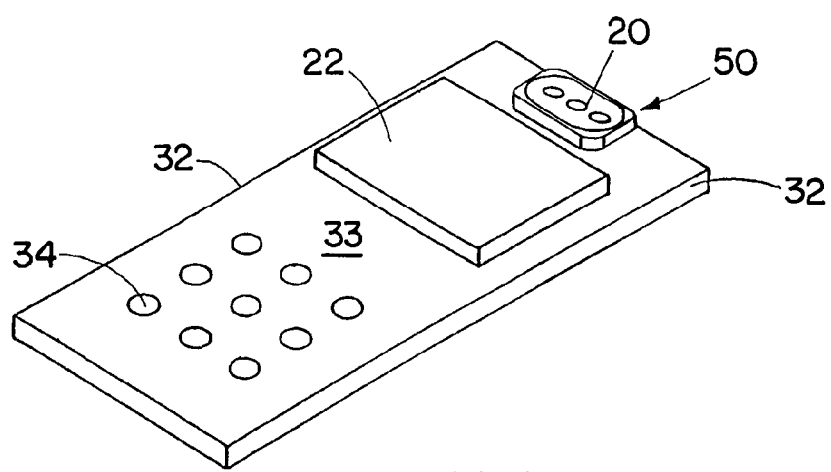
FIG. 2 is a perspective view of a circuit board of the respective mobile phone of FIG. 1.

FIG. 2 represents an exemplary circuit board 32 ordinarily positioned within the housing 18 of a mobile phone, for example, the mobile phone 10. The representation also is similar to the circuit boards of PDAs and/or other electronic equipment, as will be appreciated by those having ordinary skill in the art. The circuit board 32 includes the display 22 mounted on a top surface 33 thereof, and a plurality of key contacts 34, which may be conventional dome switch type switches as previously described. The illustrated circuit board 32 is a single layer circuit board but can have multiple layers, as will appreciated. Other components and details of the circuit board 32 have been omitted from FIG. 2 for clarity. The construction of the circuit board 32, which is presented by way of example here, is generally conventional with the exception of the functionalities provided by the compression connection illustrated used to electrically and mechanically couple the speaker 20 to the circuit board 32, which will be now be described.

Turning now to FIGS. 3-7, and initially to FIGS. 3-5, the details of the compression connector will be described. The connector 50 includes a connector body 52 for supporting an electrical component, which in the illustrated embodiment is a speaker 20. The connector body 52 in the illustrated embodiment is rectangular, however the body 52 can have any suitable shape such as a square or round shape, for example. The connector body 52 can be made of any suitable material, such as plastic or nylon, for example. The connector body 52 can be configured to support the speaker 20 in any suitable manner. For example, in the illustrated embodiment the speaker 20 is received within a recess in the connector body 52. The speaker 20 can be secured to the connector body 52 by any suitable means such as with an adhesive, for example.

A pair of slots 56 in opposing edges of the body 52 are provided for engaging opposing surfaces of a second electrical component such as the circuit board 32. As will be described in connection with FIGS. 6-8, the slots 56 are adapted to slideably receive a corresponding edge of the circuit board 32 therein. A conductive spring element 58 within each slot 56 is configured to make electrical contact with a contact on the circuit board 32, as will be described.

The springs 58 in the illustrated embodiment are leaf springs, but other types of springs can be provided such as a cantilevered spring, for example. The springs 58 can be made of any suitable material, such as a conductive metal, for example. In this manner, the springs 58 may serve as a means for electrical connection between the circuit board 32 and one or more elements of the electrical component (e.g., speaker 20) supported by the connector body 52. The springs 58 can also be made of a non-conductive material, such as plastic, and provided with a conductive element thereon for creating the electrical connection. Each spring 58 is supported by the body 52 in a manner such that it compresses when an edge of a circuit board 32 is received within a respective slot 56. In the illustrated embodiment, the springs 58 are secured at one or both ends thereof within a respective slot 56. Thus, the slots 56 are typically dimensioned to accommodate the circuit board 32 and the springs 58 in a slightly compressed state.

Figure 6:
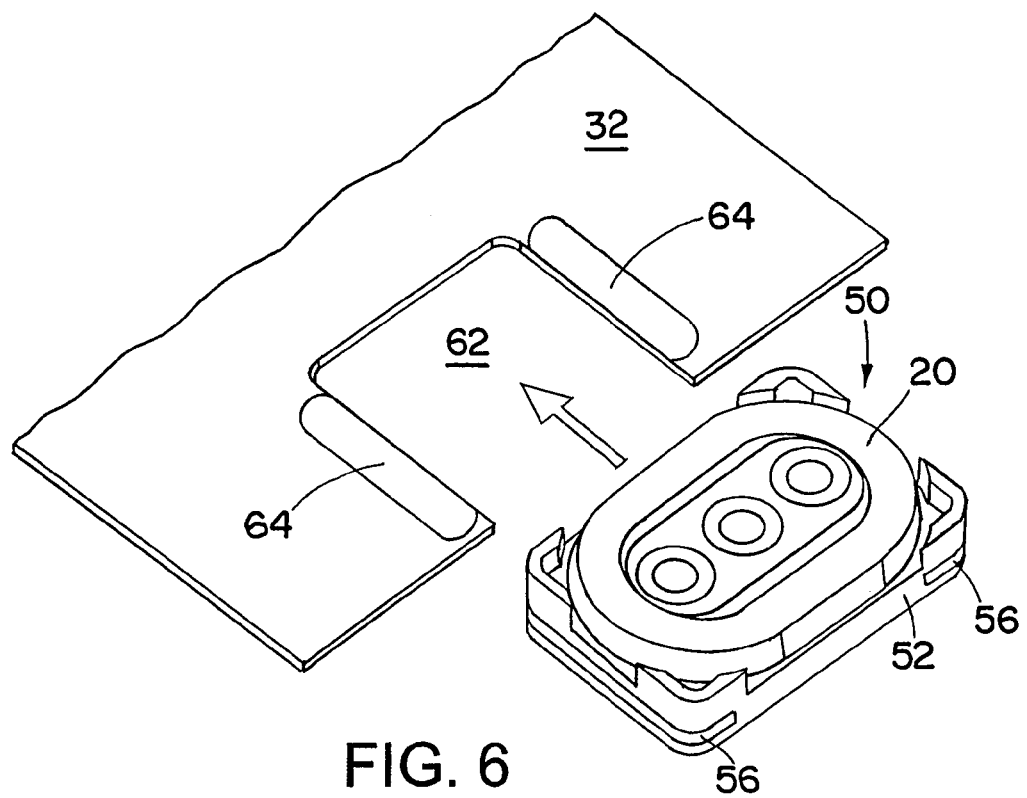
FIG. 6 is a perspective view of the speaker and a compression connector of FIG. 3 in position to be installed on a circuit board.
Figure 7:
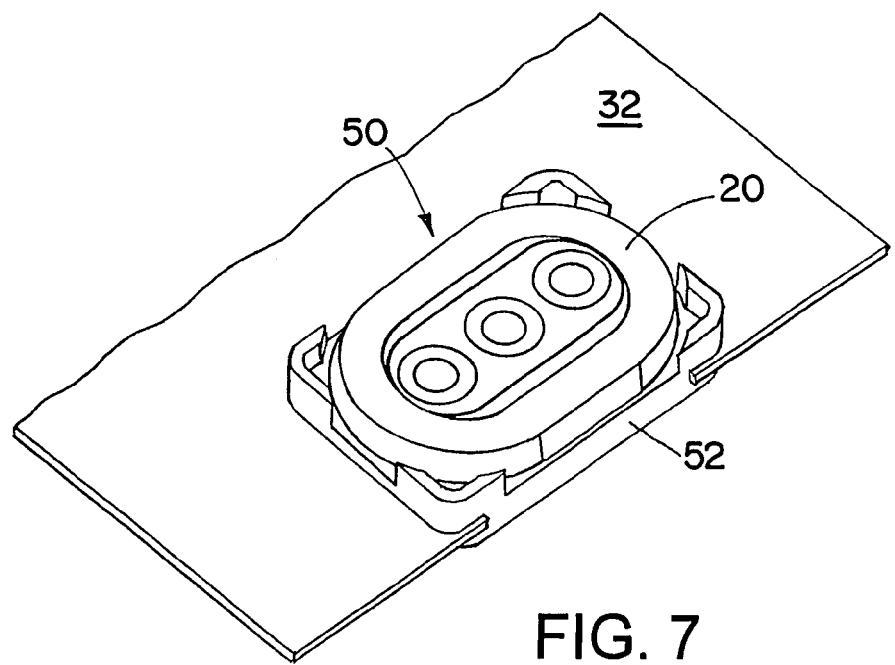
FIG. 7 is a perspective view of the speaker and a compression connector of FIG. 3 installed on the circuit board.

Turning to FIGS. 6-8, the compression connector 50 with speaker element 20 connected thereto is illustrated being assembled to the circuit board 32 of the phone 10. The circuit board 32 has a rectangular (e.g., square) notch 62 configured to receive the compression connector 50. A pair of electrical contacts 64 on the surface of the circuit board 32 are provided for making electrical contact with the conductive spring element 58 to thereby electrically couple the speaker 20 to an audio signal source or other electrical device on the circuit board 32 when the compression connector 50 is installed.

In FIG. 7, the compression connector 50 is installed on the circuit board 32 with respective edges of the circuit board 32 being received within the slots 56 of the compression connector 50. As will be appreciated, the springs 58 are compressed between a top surface of the circuit board 32 (e.g., contacts 64) and the connector body 52. Friction between the connector body 52, the springs 58 and the circuit board 32 tends to maintain the compression connector 50 in place on the circuit board 32.

It will now be appreciated that the compression connector 50 both electrically and mechanically couples the speaker 20 to the circuit board 32. Once installed within a housing, such as housing 18, the compression connector 50 can be generally further secured in place on the circuit board 32 by the housing 18, if so desired. In other words, although the compression connector does not rely on the housing 18 for maintaining the compression connection, the housing 18 can still function to secure the compression connector 50 in place on the circuit board 32. The compression connector 50, by engaging opposing sides of the circuit board 32 to maintain the compression connection rather than surfaces of the housing, avoids stressing or otherwise applying a force to the external housing 18 of an electronic device.

Turning now to FIGS. 8-14, and initially to FIGS. 8-11, another exemplary compression connector 50 is illustrated. The compression connector 50 of FIGS. 8-11 is similar in most respects to the compression connector 50 shown and described in connection with FIGS. 13-7 and includes a connector body 52 for supporting an electrical component, which again is a speaker 20. In this embodiment, however, the engagement member is a spring clip 72 supported by the connector body 52.

The spring clip 72 has a general U-shape (e.g., hairpin) having a closed end 74 and an open end 76 for receiving an edge of the circuit board 32, the open end 76 formed by the termination of a first leg portion 78 and a second leg portion 80. The first leg portion 78 of the spring clip 72 is relatively flat and is secured to the connector body 52. An upwardly turned portion 82 of the first leg portion forms a protrusion that engages a mating recess in the circuit board 32 for restricting removal of the connector 50 once installed on the circuit board 32. The second leg portion 80 of the spring clip 72 has a contact portion 83 that is generally bowed inwardly towards the first leg portion 78 for engaging the circuit board 32. A distal end 84 of the second leg portion 80 is flared outwardly away from the first leg portion 78. It will be appreciated that the first leg portion 78 and/or second leg portion 80 can also be configured to engage an electrical contact on the circuit board 32, with the second leg portion 80 generally applying the spring force. In the illustrated embodiment, the first leg portion 78 of each spring clip 72 is configured to engage electrical contacts 64.

Figure 12:
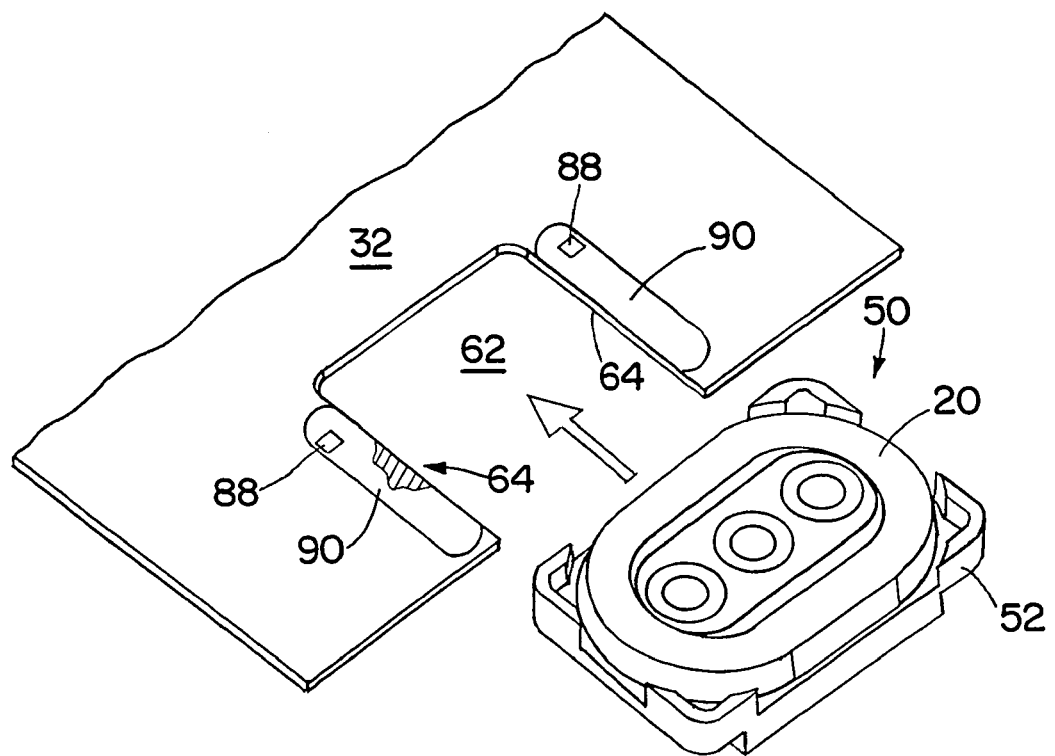
FIG. 12 is a perspective view of the speaker and a compression connector of FIG. 8 in position to be installed on a circuit board.
Figure 13:
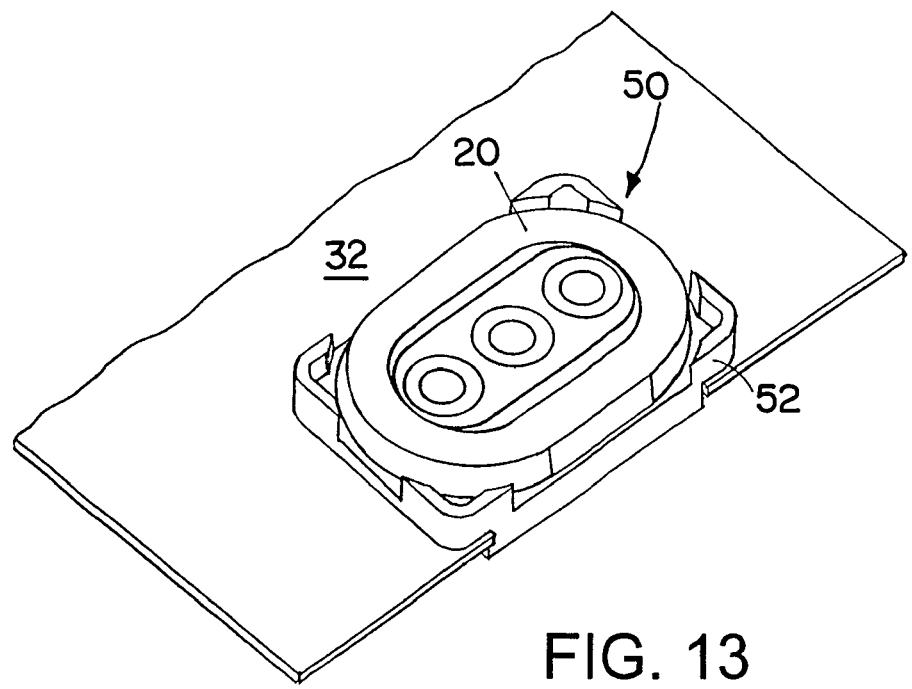
FIG. 13 is a perspective view of the speaker and a compression connector of FIG. 8 installed on the circuit board.
Figure 14:
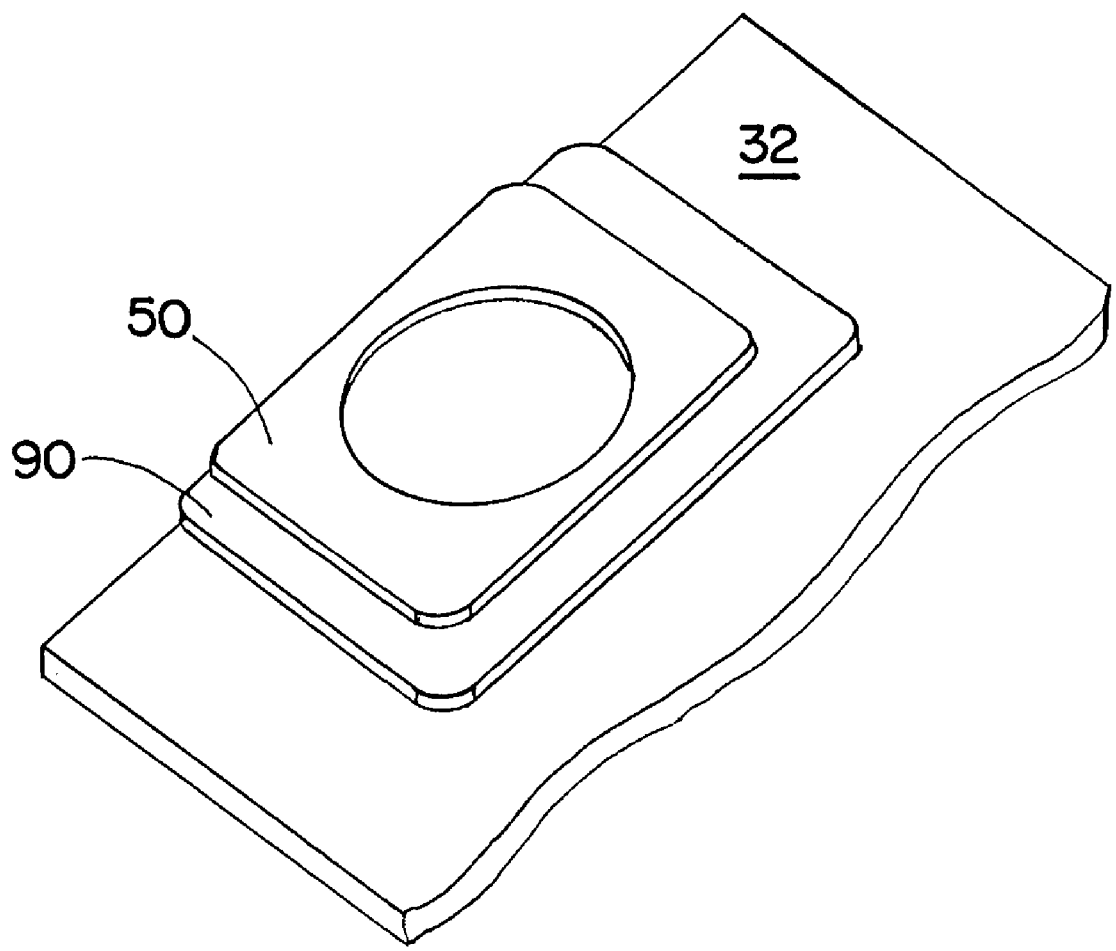
FIG. 14 is a perspective view of the underside of the compression connector installed on the circuit board in FIG. 13.

Turning now to FIGS. 12-14, the connector 50 is illustrated installed on the circuit board 32. Similar to the previously described embodiment, the circuit board 32 includes a U-shape notch 62 for receiving the connector 50. A reinforcing element 90 (FIG. 14) is provided on the circuit board bounding the edge of the slot 62 for reinforcing the circuit board 32 and/or preventing abrasion of the circuit board 32 by the spring clips 72. The electrical contacts 64 in this embodiment are provided on the top side of the circuit board 32 in a position for engagement by the spring clips 72. The electrical contacts 64 could also be provided on the underside of the circuit board 32 for engagement by the second legs 80 of the spring clips 72

In FIG. 13, the compression connector 50 is installed on the circuit board 32 with respective edges of the circuit board 32 being received within the spring clips 72. As will be appreciated, respective opposite sides of the circuit board 32 are engaged by the first and second legs of the respective spring clips 72 such that the contact portions 83 of the spring clips 72 are in electrical contact with the contacts 64 on the circuit board 32 and respective protrusions 82 on the first leg portions 78 are received in mating recesses 88 in the circuit board 32 thereby restricting unintentional removal and/or separation of the connector 50 relative to the circuit board 32. It will now be appreciated that the compression connector 50 both electrically and mechanically couples the speaker 20 to the circuit board 34.

In this embodiment the protrusions 82 generally make the mechanical connection between the circuit board 32 and the connector 50 more secure. It will be appreciated that similar cooperating protrusions and recesses could be implemented in the embodiment of FIGS. 3-7. For example, each slot 56 could include one or more recesses or protrusions for mating with cooperating recesses or protrusions on the circuit board 32.

It will now be appreciated that the compression connector 50 in FIGS. 8-11 also serves to both electrically and mechanically couple the speaker 20 to the circuit board 32. Although the compression connector 50, once installed in an electronic device such as phone 10, does not rely on the housing 18 for maintaining the compression connection, the housing 18 can still function to secure the compression connector 50 in place on the circuit board 32. The compression connector 50, by engaging opposing sides of the circuit board 32 to maintain the compression connection rather than surfaces of the housing 18, avoids stressing or otherwise applying a force to the external housing 18 of an electronic device.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A compression connector for connecting electrical components comprising:
    a connector body for supporting a first electrical component, the connector body configured to be received in a U-shape notch in a second electrical component and having an engagement member for engaging opposing surfaces of the second electrical component having an electrical contact thereon, wherein the engagement member has a conductive element configured to compressively engage the contact on the second electrical component to thereby electrically couple the first and second electrical components when the engagement member is engaged with opposing surfaces of the second electrical component;
    wherein the connector body is configured to support the first electrical component such that it generally occupies the U-shape notch in the second electrical component when the connector body is received therein.

2. A compression connector as set forth in claim 1, wherein at least a portion of the conductive element is resilient and configured to compressively engage the electrical contact on the second electrical component when the engagement member is engaged with opposing sides of the second electrical component.

3. A compression connector as set forth in claim 1, wherein the engagement member includes a slot formed in an edge of the connector body, the slot adapted to receive an edge of a circuit board of the electrical component.

4. A compression connector as set forth in claim 1, wherein the conductive element includes a spring element supported within the slot and configured to compress when the engagement member is engaged with opposing sides of the second electrical component.

5. A compression connector as set forth in claim 4, wherein the spring element includes a leaf spring.

6. A compression connector as set forth in claim 1, wherein the engagement element includes a clip configured to compressively engage opposing surfaces of the second electrical component.

7. A compression connector as set forth in claim 6, wherein the clip is a resilient conductive spring clip configured to compressively engage opposing sides of the second electrical element.

8. A compression connector as set forth in claim 1, wherein the first electronic component is a speaker.

9. A compression connector as set forth in claim 1, wherein the second electronic device is a circuit board.

10. A compression connector as set forth in claim 1, wherein the notch conforms to the shape of the connector body.

11. A compression connector for connecting electrical components comprising:
    a connector body for supporting a first electrical component, the connector body having an engagement member for engaging opposing surfaces of a U-shape notch in a second electrical component having an electrical contact thereon, wherein the engagement member has a conductive element configured to compressively engage the contact on the second electrical component to thereby electrically couple the first and second electrical components when the engagement member is engaged with opposing surfaces of the second electrical component; and wherein the engagement member includes a recess or protrusion configured to cooperate with a mating protrusion or recess on the second electrical component to restrict removal of the connector therefrom once installed.

12. An electronic device comprising:
a first electrical component;
a second electrical component; and
a compression connector for electrically coupling the first and second electrical components;
wherein the connector includes a connector body supporting the first electrical component, the connector body being received within a U-shape notch in the second electrical component and having an engagement member for engaging opposing surfaces of the second electrical component;
wherein the engagement member has a conductive element configured to make electrical contact with an electrical contact on the second electrical component to thereby electrically couple the first and second electrical components; and
wherein the first electrical component is supported by the connector body such that it generally occupies the U-shape notch.

13. An electronic device as set forth in claim 12, wherein at least a portion of the conductive element is resilient and configured to compressively engage the electrical contact on the second electrical component when the engagement member is engaged with opposing sides of the second electrical component.

14. An electronic device as set forth in claim 12, wherein the engagement member includes a slot formed in an edge of the connector body, the slot adapted to receive an edge of a circuit board of the electrical component.

15. An electronic device as set forth in claim 14, wherein the conductive element includes a spring element supported within the slot and configured to compress when the engagement member is engaged with opposing sides of the second electrical component.

16. An electronic device as set forth in claim 15, wherein the spring element includes a leaf spring.

17. An electronic device as set forth in claim 12, wherein the engagement element includes a clip configured to compressively engage opposing surfaces of the second electrical component.

18. An electronic device as set forth in claim 17, wherein the clip is a resilient conductive spring clip configured to compressively engage opposing sides of the second electrical element.

19. An electronic device as set forth in claim 12, wherein the first electronic component is a speaker.

20. An electronic device as set forth in claim 12, wherein the second electronic component is a circuit board.

21. A compression connector as set forth in claim 12, wherein the notch conforms to the shape of the connector body.

22. An electronic device as set forth in claim 12, wherein the electronic device is a mobile telephone.

23. An electronic device comprising:
a first electrical component;
a second electrical component; and
a compression connector for electrically coupling the first and second electrical components;
wherein the connector includes a connector body for supporting the first electrical component, the connector body having an engagement member for engaging opposing surfaces of the second electrical component;
wherein the engagement member has a conductive element configured to make electrical contact with an electrical contact on the second electrical component to thereby electrically couple the first and second electrical components; and wherein the engagement member includes a recess or protrusion configured to cooperate with a mating protrusion or recess on the second electrical component to restrict removal of the connector therefrom once installed.

* * * * *